United States Patent
Biloiu et al.

(10) Patent No.: US 11,056,319 B2
(45) Date of Patent: Jul. 6, 2021

(54) APPARATUS AND SYSTEM HAVING EXTRACTION ASSEMBLY FOR WIDE ANGLE ION BEAM

(71) Applicant: APPLIED Materials, Inc., Santa Clara, CA (US)

(72) Inventors: Costel Biloiu, Rockport, MA (US); Appu Naveen Thomas, Danvers, MA (US); Tyler Rockwell, Wakefield, MA (US); Frank Sinclair, Boston, MA (US); Christopher Campbell, Newburyport, MA (US)

(73) Assignee: APPLIED Materials, Inc., Santa Clara, CA (US)

( * ) Notice: Subject to any disclaimer, the term of this patent is extended or adjusted under 35 U.S.C. 154(b) by 0 days.

(21) Appl. No.: 16/524,646

(22) Filed: Jul. 29, 2019

(65) Prior Publication Data

US 2021/0035779 A1    Feb. 4, 2021

(51) Int. Cl.
*H01J 37/32* (2006.01)
*H01J 37/08* (2006.01)

(52) U.S. Cl.
CPC ........ *H01J 37/32541* (2013.01); *H01J 37/08* (2013.01); *H01J 37/3255* (2013.01); *H01J 37/32422* (2013.01)

(58) Field of Classification Search
CPC ........... H01J 37/32541; H01J 37/32422; H01J 37/08; H01J 37/3255; H01J 27/024; H01J 37/32568; H01J 37/32623; C23C 14/48
See application file for complete search history.

(56) References Cited

U.S. PATENT DOCUMENTS

| | | | |
|---|---|---|---|
| 8,513,619 B1 | 8/2013 | Nasser-Ghodsi et al. | |
| 9,293,301 B2* | 3/2016 | Biloiu | H01J 37/32532 |
| 10,224,181 B2* | 3/2019 | Biloiu | H01J 37/32422 |
| 2008/0132046 A1* | 6/2008 | Walther | H01J 37/08 |
| | | | 438/513 |
| 2010/0255665 A1* | 10/2010 | Godet | C23C 14/48 |
| | | | 438/513 |
| 2015/0371827 A1 | 12/2015 | Godet et al. | |

(Continued)

FOREIGN PATENT DOCUMENTS

WO    2011155917 A1    12/2011

OTHER PUBLICATIONS

International Search Report dated Oct. 8, 2020, for the International Patent Application No. PCT/US2020/039179, filed on Jun. 23, 2020, 4 pages.

(Continued)

*Primary Examiner* — Wyatt A Stoffa
(74) *Attorney, Agent, or Firm* — Kacvinsky Daisak Bluni PLLC

(57) ABSTRACT

An ion beam processing apparatus may include a plasma chamber, and a plasma plate, disposed alongside the plasma chamber, where the plasma plate defines a first extraction aperture. The apparatus may include a beam blocker, disposed within the plasma chamber and facing the extraction aperture. The apparatus may further include a non-planar electrode, disposed adjacent the beam blocker and outside of the plasma chamber; and an extraction plate, disposed outside the plasma plate, and defining a second extraction aperture, aligned with the first extraction aperture.

17 Claims, 15 Drawing Sheets

(56) References Cited

U.S. PATENT DOCUMENTS

| | | | |
|---|---|---|---|
| 2016/0071693 A1* | 3/2016 | Biloiu ............... | H01J 37/32357 |
| | | | 204/192.34 |
| 2016/0093409 A1* | 3/2016 | Nam ................. | H01J 37/32422 |
| | | | 250/515.1 |
| 2017/0042010 A1* | 2/2017 | Liang .................. | H01J 37/3244 |
| 2017/0178866 A1* | 6/2017 | Radovanov ....... | H01J 37/32422 |
| 2018/0076007 A1* | 3/2018 | Gilchrist ........... | H01J 37/32422 |
| 2018/0174843 A1* | 6/2018 | Anglin ................ | H01L 21/2633 |

OTHER PUBLICATIONS

Written Opinion dated Oct. 8, 2020, for the International Patent Application No. PCT/US2020/039179, filed on Jun. 23, 2020, 5 pages.

\* cited by examiner

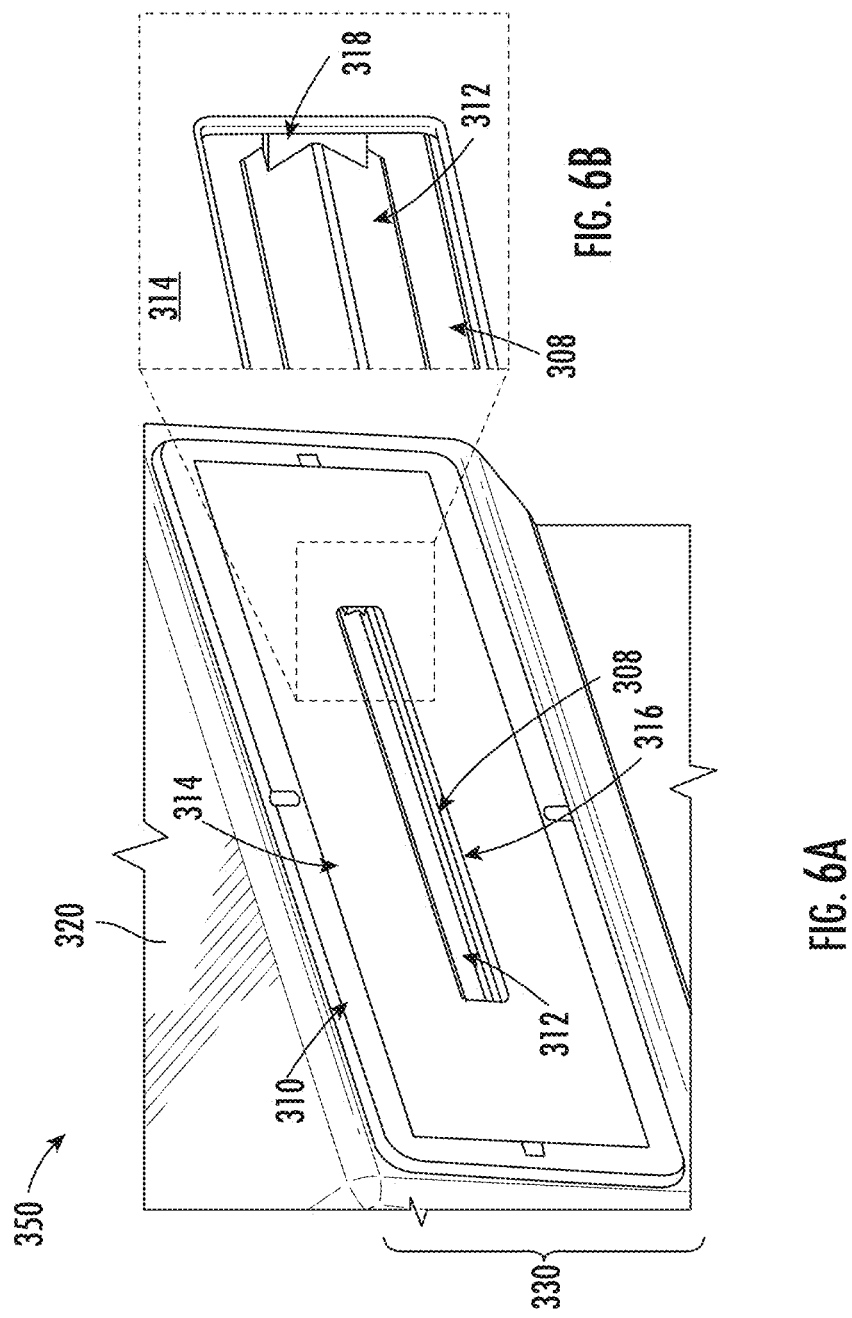

APPARATUS AND SYSTEM HAVING EXTRACTION ASSEMBLY FOR WIDE ANGLE ION BEAM

FIELD

The present embodiments relate to a plasma processing apparatus, and more particularly to angled ion beams extracted from a plasma source using a novel ion extraction optics.

BACKGROUND

Fabrication of complex 3D semiconductor structures often employs ion assisted plasma processes. Many of such processes use an ion beam having zero or small incidence angle, with respect to normal to the substrate plane. However, there are processes such as controlled etching of trench sidewalls, where ion beams having ion angular distributions (IAD) characterized by a high mean angle (>50°) with respect to normal are called for. Such high incidence angles can be obtained by extracting the beam at zero degrees (with respect to the wafer normal when a wafer is oriented at a default "horizontal" orientation) and tilting the wafer at the desired angle. For example, an ion beam having a smaller cross-section than the area of a substrate to be processed may be directed to impinge generally along a normal orientation to the horizontal plane, while the tilted substrate (with respect to the horizontal plane) is scanned along the horizontal direction to expose in a sequential fashion the entirety of the substrate to the ion beam. The drawback of this approach is the process non-uniformity across the wafer surface: given the inherent beam divergence, there will be a variation in the ion beam dose as the wafer (substrate) is scanned in front of the beam.

It is with respect to these and other considerations that the present disclosure is provided.

SUMMARY

This Summary is provided to introduce a selection of concepts in a simplified form that are further described below in the Detailed Description. This Summary is not intended to identify key features or essential features of the claimed subject matter, nor is the summary intended as an aid in determining the scope of the claimed subject matter.

In one embodiment, an ion beam processing apparatus is provided. The apparatus may include a plasma chamber, and a plasma plate, disposed alongside the plasma chamber, where the plasma plate defines a first extraction aperture. The apparatus may include a beam blocker, disposed within the plasma chamber and facing the extraction aperture. The apparatus may further include a non-planar electrode, disposed adjacent the beam blocker and outside of the plasma chamber; and an extraction plate, disposed outside the plasma plate, and defining a second extraction aperture, aligned with the first extraction aperture.

In another embodiment, an ion beam processing system may include a plasma chamber, and an extraction assembly, disposed along a side of the plasma chamber. The extraction assembly may include a plasma plate, disposed alongside the plasma chamber, where the plasma plate defines a first extraction aperture. The extraction assembly may include a beam blocker, disposed within the plasma chamber and facing the extraction aperture, a non-planar electrode, disposed adjacent the beam blocker and outside of the plasma chamber; and an extraction plate, disposed outside the plasma plate, and defining a second extraction aperture, aligned with the first extraction aperture. The processing system may also include an extraction voltage system, electrically coupled to the plasma chamber and the extraction plate to generate a bias voltage between the extraction plate and the plasma chamber.

In a further embodiment, a method may include generating a plasma in a plasma chamber, and providing an extraction assembly along a side of the plasmas chamber. The extraction assembly may include a plasma plate, disposed alongside the plasma chamber, the plasma plate defining a first extraction aperture. The extraction assembly may also include a beam blocker, disposed within the plasma chamber and facing the extraction aperture, a non-planar electrode, disposed adjacent the beam blocker and outside of the plasma chamber; and an extraction plate, disposed outside the plasma plate, and defining a second extraction aperture, aligned with the first extraction aperture. The method may further include applying a bias voltage to extract the ion beam, wherein the ion beam is extracted as a pair of beamlets, through a pair of apertures, defined by the plasma plate, the beam blocker, the non-planar electrode and the extraction plate. As such, the applying the bias voltage may involve applying a first voltage to the plasma chamber and applying a second voltage to the extraction plate and to a substrate, disposed outside of the plasma chamber.

BRIEF DESCRIPTION OF THE DRAWINGS

FIG. 6A illustrates a face view of an extraction assembly according to embodiments of the disclosure;

FIG. 6B illustrates a detail of the extraction assembly of FIG. 6A;

DETAILED DESCRIPTION

Figure 1:
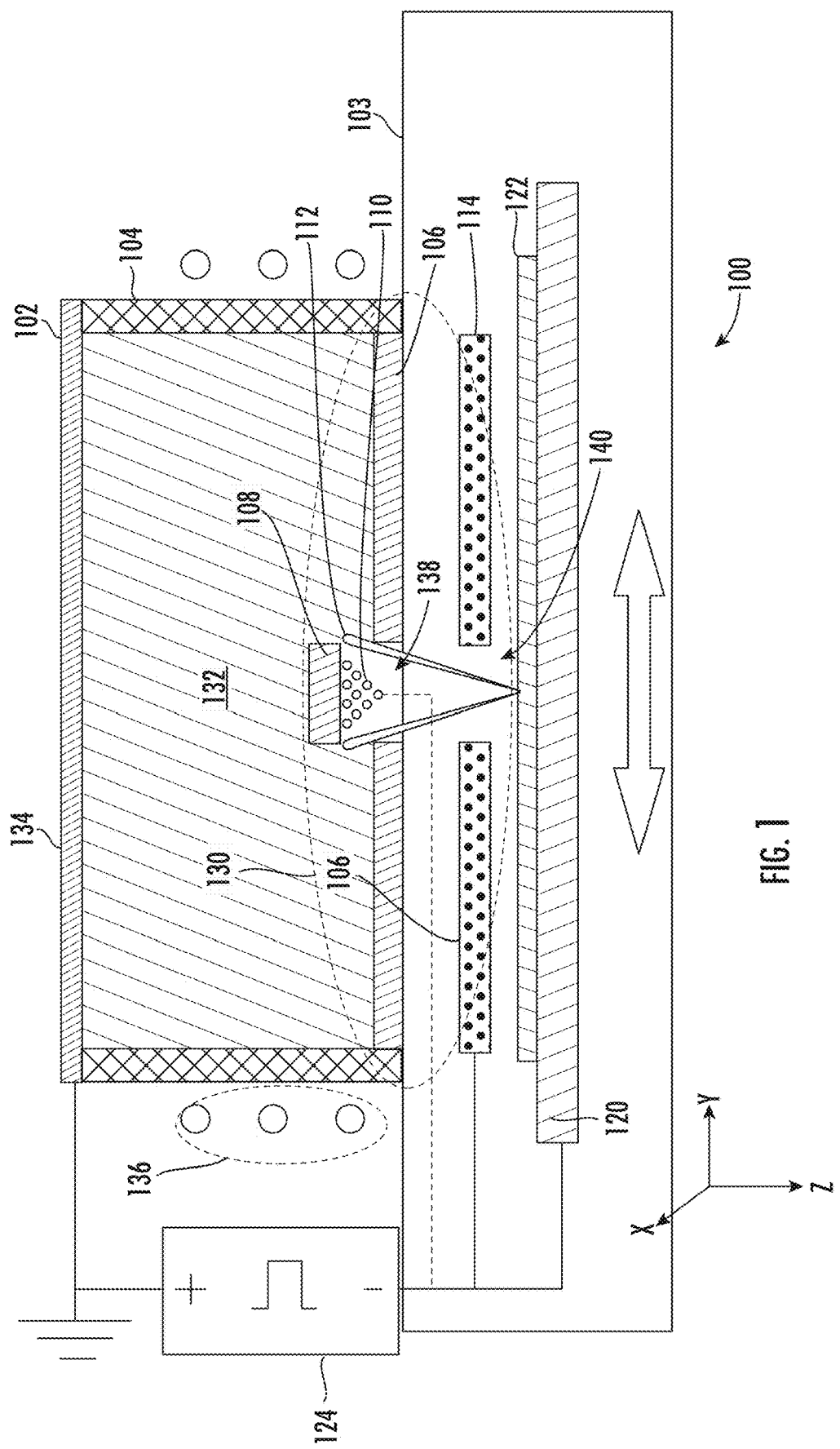
FIG. 1 presents a vertical cross-section of a processing apparatus consistent with embodiments of this disclosure.

The present embodiments will now be described more fully hereinafter with reference to the accompanying drawings, where some embodiments are shown. The subject matter of the present disclosure, however, may be embodied in many different forms and should not be construed as limited to the embodiments set forth herein. Rather, these embodiments are provided so that this disclosure will be thorough and complete, and will fully convey the scope of the subject matter to those skilled in the art. In the drawings, like numbers refer to like elements throughout.

The embodiments described herein provide apparatus, systems, and methods for controlling angular distribution of ions directed to a substrate using a hidden deflection electrode. In some embodiments, an apparatus is disclosed, facilitating the generation of ion beams having large on-wafer incidence angles in a compact ion beam source. In addition to extraction of ion beams having high incidence angles, the present embodiments may be used in the case of chemically reactive plasmas (feedstock gases: $C_xF_y$, $SF_6$, $H_2$, $O_2$, $Cl_2$, $I_2$, $Br_2$, and/or their mixtures) to generate ions and highly reactive radicals. In particular, ion beams ranging from a few hundred eV to a few keV, having high on-wafer incident angles)(>50°) and beam currents of a few tens of mA may be extracted. As an example of device processing, the use of symmetrical ribbon beamlets extraction, provided by the present embodiments, allows simultaneous processing of vertical trench walls in complex semiconductor structures as a substrate is scanned parallel with an extraction assembly.

In the embodiments to follow, an ion beam processing apparatus may include a plasma chamber and an extraction assembly. The extraction assembly may include a plasma plate, disposed along a side of the plasma chamber, where the plasma plate includes a first extraction aperture. According to various embodiments of the disclosure, the plasma plate may be formed of an insulator material. The extraction assembly may include a beam blocker, disposed within the plasma chamber, while facing the extraction aperture. As such, the beam blocker may serve to divide the extraction aperture into two separate sub-apertures. The extraction assembly may include a non-planar electrode, disposed adjacent the beam blocker and outside of the plasma chamber, as well as an extraction plate, disposed outside the plasma plate, and defining a second extraction aperture, aligned with the first extraction aperture. As described in the embodiments to follow, this arrangement facilitates generation of high angle ion beams through the sub-apertures, where the high angled ion beams define a large angle of incidence with respect to perpendicular to a plane of the plasma plate, such as 30 degrees or greater.

As detailed below, the extraction assembly in various embodiments may include a plasma plate having an electrical insulator body and a beam blocker having an electrical insulator body. At the same time, the non-planar electrode may include an electrically conductive inner electrode and the extraction plate may include an electrically conductive inner plate portion. In particular embodiments, the non-planar electrode comprises a first dielectric coating, surrounding the electrically conductive inner electrode, and the extraction plate includes a second dielectric coating, disposed on the electrically conductive inner plate portion.

Advantageously, the non-planar electrode may have a triangular shape in cross-section along a first direction, where the first direction is perpendicular to the plane of the plasma plate. In further embodiments detailed below, the extraction assembly may include a movable extraction plate that is movable with respect to a plasma plate, along one or more directions. The first extraction aperture of the plasma plate and second extraction aperture of the extraction plate may each have an elongated shape, facilitating the extraction of a pair of ribbon ion beams, or ribbon ion beamlets and directing the ribbon ion beamlets at wide angles to a substrate, aligned parallel to the plane of the plasma plate, for example. Without limitation, the term "wide angle(s) to a substrate" as used herein may greater than 30 degrees with respect to a normal (perpendicular) to a plane of the substrate, greater than 40 degrees with respect to the normal, or greater than 50 degrees with respect to the normal, for example. In particular embodiments, the extraction plate may include a first part and a second part, mutually movable with respect to one another along a scan direction, so as to change the size of the second extraction aperture.

Turning now to FIG. 1, there is shown a vertical cross-section of a processing system, consistent with embodiments of this disclosure. The processing system 100 includes a plasma chamber 102, a process chamber 103, and extraction assembly 130, described in more detail below. The processing system 100 further includes an extraction voltage system 124, electrically coupled to generate a bias voltage between an extraction plate 114 and the plasma chamber 102. As such, the processing system 100 acts as an ion beam processing system to generate ion beams for processing a substrate 122, arranged proximate to the extraction plate 114. The plasma chamber 102 may act as a plasma source to generate a plasma 132 in the plasma chamber 102 by any suitable approach. For example, the plasma chamber 102 may be referenced to a ground potential through electrically conductive wall 134. Ionic (ion) species of interest may be produced in the plasma 132 by inductively coupling an rf power generated by an rf power source (not separately shown) from an rf antenna 136 to a working gas through a dielectric window 104. However, other known means of generating a plasma are possible.

As shown in FIG. 1, the extraction assembly 130 may include a plasma plate 106, disposed along a side of the plasma chamber 102, where the plasma plate 106 may be formed of an electrical insulator, such as $Al_2O_3$ (alumina), quartz, AlN or other suitable electrically insulating material. The plasma plate 106 may define a first extraction aperture 138, which aperture may be elongated along the X-axis of the Cartesian coordinate system shown (note the x-axis generally extends perpendicularly into the plane of the page, but is shown at an angle for purposes of illustration). As such, the first extraction aperture 138 may define a space, through which space, ions from the plasma chamber 102 may pass. The extraction assembly 130 may further include an extraction plate 114, disposed outside the plasma chamber 102, and formed of an electrically conductive material. The extraction assembly 130 may also include a beam blocker 108, formed, for example, of an insulating material. In the arrangement of FIG. 1, when a negative voltage is applied to the substrate 122 (or to a substrate plate 120), with respect to the plasma chamber 102, in the presence of the plasma 132, plasma menisci are formed in the slits (sub-apertures), formed between the extraction aperture 138 and the beam blocker 108. In various embodiments, the beam blocker 108 may be arranged symmetrically above the extraction aperture 138 to allow formation and extraction of two symmetrical ion beamlets, shown as ion beams 112. Ion beam processing of the substrate 122 takes place by scanning the substrate 122 in the y direction and, may also include by rotating the substrate around the z axis. In various non-limiting embodiments, depending on the electrical conductivity of the substrate 122 (thick or thin oxide), the ion beams 112 may be extracted as pulsed ion beams, where a pulsing frequency and the duty cycle may be adjusted to a target value in the 10-50 kHz range, and 10-100% range, respectively, so that the substrate does not charge-up. Advantageously, the use of dielectric materials for the extraction plate 114 and beam blocker 108 facilitates use in highly reactive plasmas used to generate ionic and radical species.

The extraction assembly 130 may also include a biasable blocker electrode, shown as non-planar electrode 110. As illustrated in FIG. 1, the non-planar electrode 110 is attached to the beam blocker 108, outside the plasma chamber 102. As illustrated generally in FIG. 1, the beam blocker 108 and plasma plate 106, while not co-planar, may be deemed to define the border between the inside of the plasma chamber 102 and outside of the plasma chamber 102 on the lower side. Thus, the non-planar electrode 110, whether disposed above the plasma plate 106 or not, may be deemed to lie on the outside of the plasma chamber 102. In some non-limiting embodiments, the non-planar electrode 110 may have a triangular-like or parabolic-like shape in cross-section as viewed along the Z-direction (parallel to the Z-axis). Being electrically conductive, the electrode shape has the role of molding the distribution of equipotential field lines and consequently adjusting the angular distribution (mean angle and angular spread) of the extracted ion beamlets. More particularly, because the equipotential lines of an electric field follow the shape of the electrically conductive electrode a better distribution of the field lines may be realized by these electrode shapes. Notably, the triangular or parabolic shape serves to shape the field lines in the extraction area so that a plasma meniscus forming at the plasma edge will have a smaller radius, resulting in better focusing of the extracted ion beamlets.

According to some embodiments of the disclosure the extraction plate 114 may define a second extraction aperture 140, as shown. The extraction plate 114 and second extraction aperture 140 are thus disposed between the plasma plate 106 and the substrate 122. In some non-limiting embodiments, the second extraction aperture 140 may have a height of 30-50 mm in the y direction. Of course in particular embodiments, discussed below, the height of the extraction aperture along the y direction may be variable. In various embodiments of the disclosure, the plasma plate 106, extraction plate 114, and substrate 122 may be mutually parallel to one another and may lie parallel to the X-Y plane. Thus, the plane of the plasma plate 106 may be deemed to be a plane that is parallel to the X-Y plane, and generally parallel to the scan direction (y-direction) of the substrate 122.

The first extraction aperture 138 and second extraction aperture 140 may be aligned in a perfectly symmetric manner with respect to the non-planar electrode 110 and beam blocker 108, so that a symmetry of the two ion beamlets (ion beams 112) extracted from the slits between the beam blocker 108 and plasma plate 106 is established. In some embodiments, the beam blocker 108, the non-planar electrode 110, the first extraction aperture 138 and the second extraction aperture 140 may be elongated so as to extend in x direction for 350 mm-400 mm so that uniform ribbon beamlets of 300 mm width (in the x-direction, can be extracted.

According to various non-limiting embodiments, the biasable elements of the extraction assembly 130, such as non-planar electrode 110 and extraction plate 114, may be set at the same electrical potential as the substrate 122, which configuration means the substrate is advantageously not part of the extraction optics. In particular, because the substrate 122 is at the same potential as the non-planar electrode 130 and extraction plate 114, there is no potential difference and consequently no electric field between the substrate 122 and the extraction plate 114 or non-planar electrode 110.

Thus, the relative position of the substrate 122 with respect to the extraction optics, such as extraction plate 114 and plasma plate 106, does not affect ion angular distribution of ion beams extracted through extraction assembly 130. Under this condition the substrate location along the Z-axis can be varied from 5 mm to more than 20 mm so that plasma chamber contamination with material sputtered from the substrate can be diminished considerably. In other words, when needed, the substrate may be located at a larger separation from the extraction assembly along the Z-axis to reduce contamination, since contamination decreases as the solid angle the extraction apertures "see" the wafer becomes smaller as the separation is increased.

To be electrically biasable, the non-planar electrode 110 and the extraction plate 114 may be constructed of electrically conductive materials (e.g., metals, such as aluminum, titanium, or copper, graphite, doped Si, doped SiC may be used for these components in some non-limiting embodiments), as noted above. Because these parts are not exposed to ion beam bombardment, as detailed below, metal and/or carbon contamination is reduced. However, according to some embodiments, for a fuller protection against contamination, the electrically biasable parts may be coated with a thin dielectric film surrounding an inner body or portion that is electrically conductive. In one nonlimiting embodiment, a suitable dielectric coating is made of a mixture of yttrium, aluminum, and zirconium oxides, and has a thickness of 100 micrometers. Such dielectric material is known to provide resistance against etching. In other embodiments, $Al_2O_3$, AlFO, yttrium oxide ($Y_2O_3$), or zirconium oxide ($ZrO_2$) may be used as a dielectric coating. In embodiments where the non-planar electrode 110 and the extraction plate 114 are formed of silicon or silicon carbide materials, the dielectric coating may optionally be omitted, because Si or carbon may not be considered as electrical contaminants for semiconductor devices based upon silicon, for example.

As is known, the shape and location of a plasma meniscus and the mechanism of ion beam extraction depends on the relative values of the plasma density in a plasma, such as plasma 132, and further depends on the extraction electric field. However, when non-electrically conductive materials, such as dielectrics, are used to make ion extraction optics, the physics for ion beam extraction changes considerably. This change happens because the plasma sheath, which sheath is the interface between the plasma 132 and the ion extraction optics walls (in the present embodiments, the beam blocker 108 and plasma plate 106) is a function of the nature of the wall: insulating or conducting. For pulsed plasmas for which pulsing frequency (f) is higher than ion plasma frequency (fpi)

$$f_{pi} = \frac{1}{2\pi}\left(\frac{ne^2}{\varepsilon_0 m_i}\right)^{\frac{1}{2}} \tag{1}$$

where n, $e_0$, and $m_i$ are the plasma density, elementary charge, dielectric constant of vacuum, and ion mass, we have the so-called matrix sheath, where the ions are immobile and electrons are pushed away from the wall. In this case the sheath thickness is given by $$s = \lambda_D \left(\frac{2eV_0}{k_B T_e}\right)^{\frac{1}{2}} \tag{2}$$

where, $V_0$, $k_B$, and $T_e$ stand for voltage drop across the sheath, Boltzmann constant, and electron temperature, respectively. The quantity denoted by $\lambda_D$ is Debye length given by $$\lambda_D = \left(\frac{\varepsilon_0 k_B T_e}{n e^2}\right)^{\frac{1}{2}} \qquad (3)$$

Depending on the value of the voltage on the wall, in the case of matrix sheath, the sheath thickness can range from tens to hundredth of Debye lengths. However, for usual plasma densities between $5 \times 10^9$ and $5 \times 10^{11}$ cm$^{-3}$ the ion plasma frequency is between 2 MHz and 25 MHz much higher than pulsing frequency of the extraction voltage (10 to 50 kHz). In this case ions have enough time to be accelerated by the electric field in the sheath and assuming their motion is collisionless, the sheath thickness is given by Child's law:

$$s = \frac{\sqrt{2}}{3}\lambda_D \left(\frac{2eV_0}{k_B T_e}\right)^{\frac{3}{4}} \qquad (4)$$

Assuming an electron temperature of 3.5 eV the sheath thickness increases with voltage and with the inverse of plasma density and for ranges of interest varies from few fractions of millimeter to approximately 20 millimeters.

In accordance with various embodiments, the ion beams of the present embodiments may be extracted as pulsed ion beams, as noted above. The extraction voltage system may, for example, include a pulse component, such as circuitry to pulse an extraction voltage on and off according to a targeted pulse period and duty cycle. However, in the case of small ion beam currents the pulsing duty cycle may be 100%, i.e., the ions are extracted continuously. In particular, the pulse period and duty cycle may be arranged to facilitate extraction of angled ion beams as discussed below. Because the beam blocker and plasma plate components may be formed of dielectric material, the pulsing of an ion beam may be arranged to take into account the time-dependent evolution of plasma sheaths.

Figure 2A:
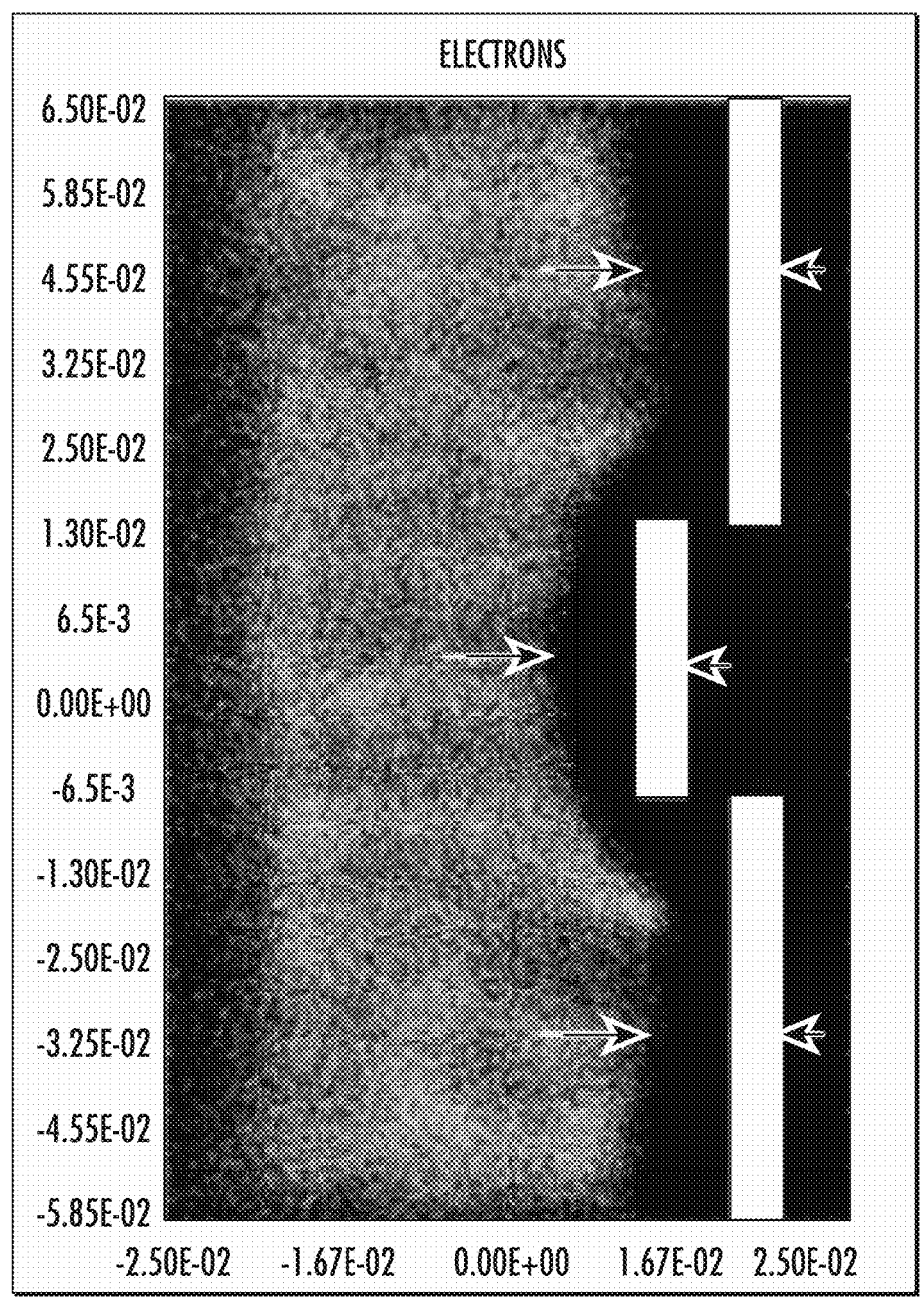
FIGS. 2A-2D depict collectively, the evolution of electron and ion distributions as a function of time, in accordance with embodiments of the disclosure.
Figure 2B:
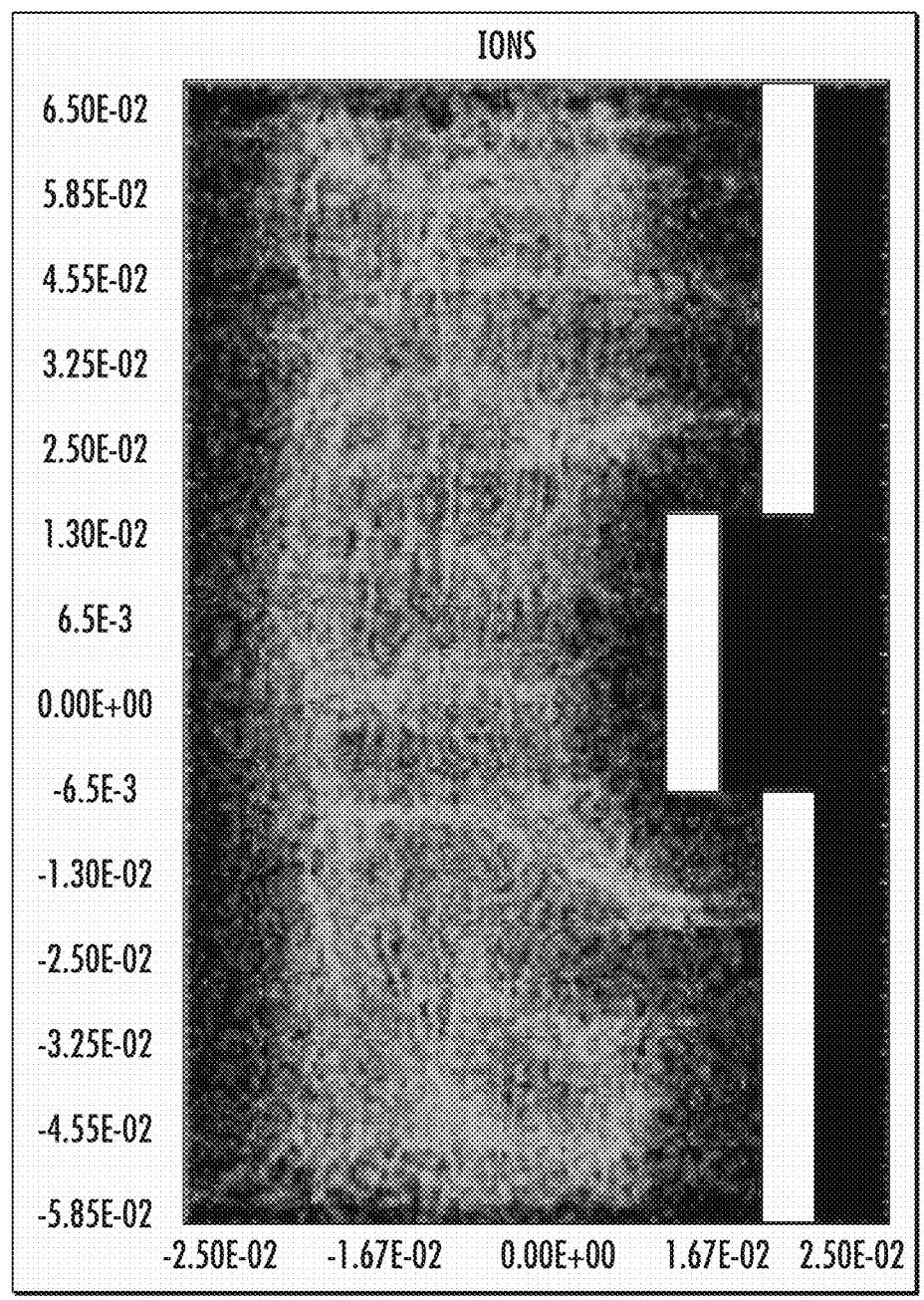

Turning to FIGS. 2A-2D the evolution of electron and ion distributions as a function of time is shown in X-Y space, in accordance with embodiments of the disclosure. In the simulation shown, the voltage on a substrate (which position is represented by the vertical line at x=2.5 cm) is pulsed at −1 kV voltage with a 20 kHz pulsing frequency and 50% duty cycle. The beam blocker and plasma plate components are shown schematically as the bright vertically elongated rectangles, where the origination of these components is 90 degrees rotated with respect to FIG. 1. The beam blocker and plasma plate are modeled as made of dielectric material (quartz), which material is allowed to charge up electrostatically. The FIGS. 2A and 2B show electron and ion distributions, respectively, at 1 μs after start of an applied negative voltage pulse. Because the quartz allows transmission of electric field lines, at the beginning of a pulse (1 μsec) a high voltage drop occurs on the sheath, which situation consequently develops a sheath of considerable thickens (~6 mm). In this case, as shown in both FIG. 2A and FIG. 2B. The electric field in the vicinity of extraction slit is oriented perpendicularly to the plasma plate and beam blocker (along the x-direction) and as a result very few, if any, ions are extracted (see ion distribution in FIG. 2B).

Figure 2C:
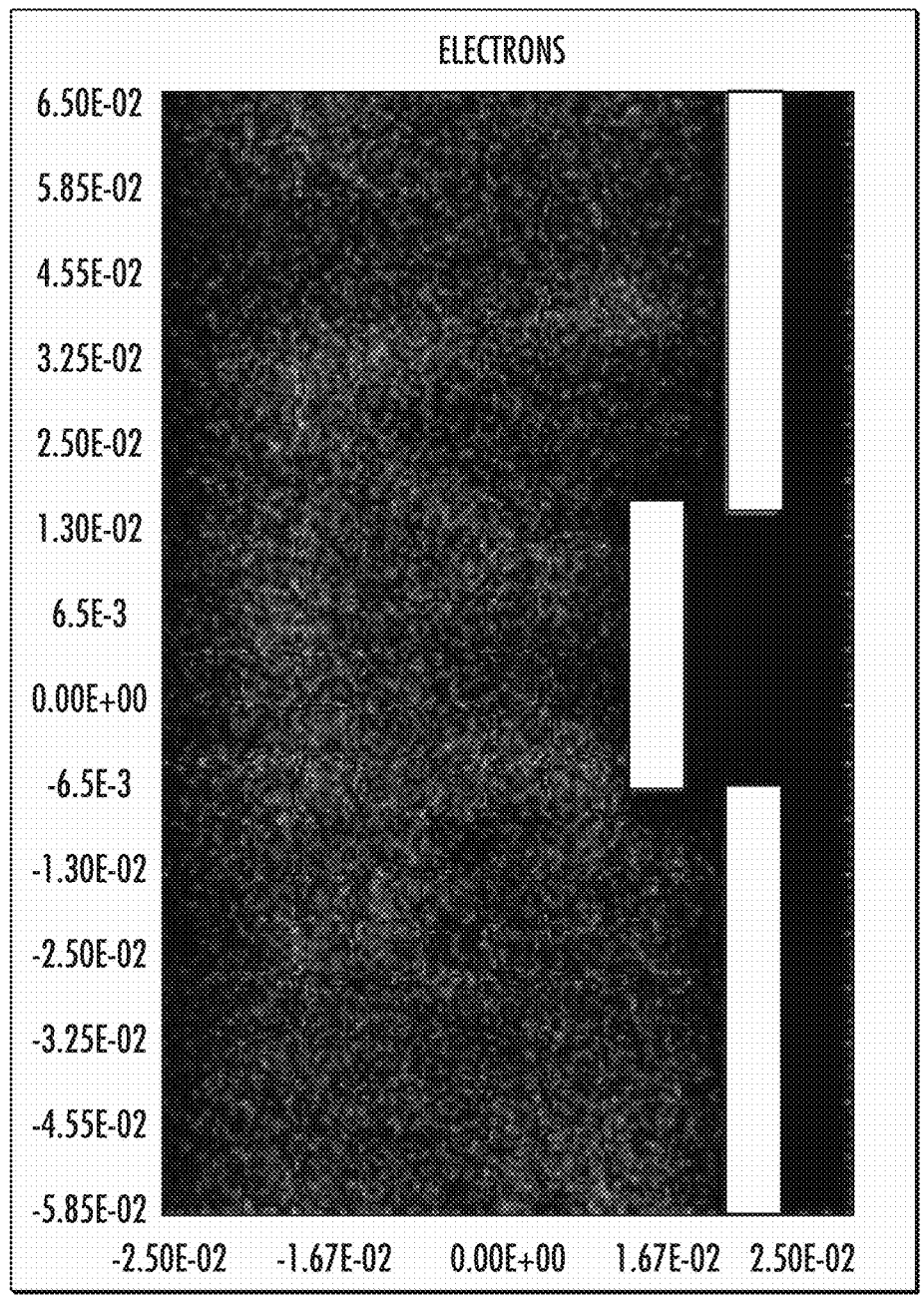
Figure 2D:
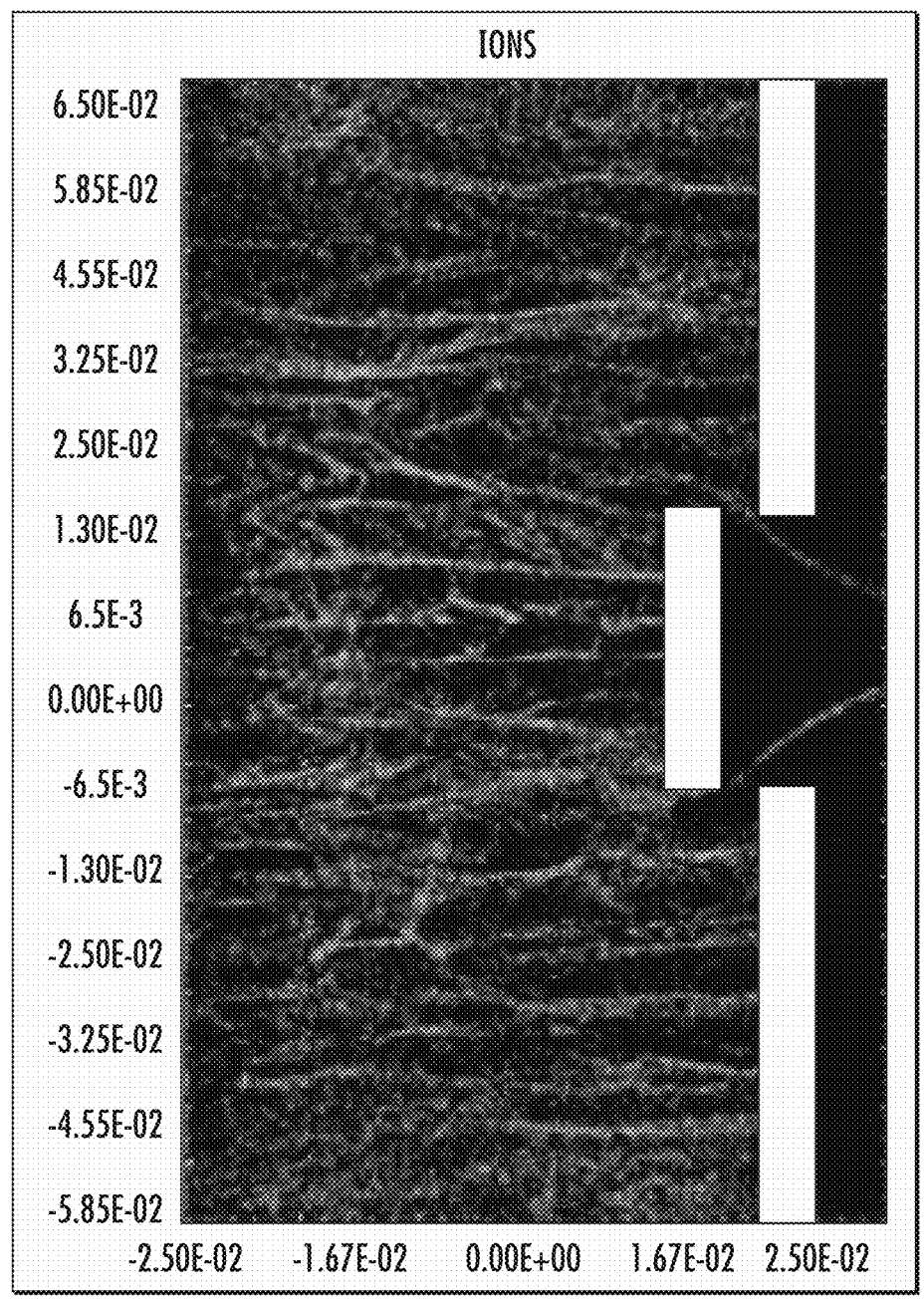

Turning now to FIGS. 2C and 2D, as the plasma sheath evolves with time, ions continue to arrive at the inner walls of the plasma plate and plasma blocker. In the absence of a path to ground, the ions will create an imbalance in the plasma density, which situation will lead to the formation of a ambipolar electric field. In this case equal fluxes of electrons and ions will be directed toward the inner walls $$\vec{\Gamma} = -D_a \vec{\nabla} n \qquad (5)$$

where $\vec{\nabla} n$ is the gradient of plasma density in the direction perpendicular to faceplate and blocker walls (x direction) and Da is the ambipolar diffusion coefficient $$D_a = \frac{\mu_e D_i + \mu_i D_e}{\mu_e + \mu_i} \qquad (6)$$

where $\mu_{e,i}$ and $D_{e,i}$ are mobilities and diffusion coefficients of electrons and ions, respectively. As a result of ambipolar diffusion, the sheath thickness decreases (collapses) until the point where plasma menisci are formed in the extraction slits and the ion beamlets start to be extracted. This decrease of the sheath thickness can be seen in FIG. 4C and FIG. 4D, where the x-y phase space for electrons and ions at 4 μsec after commencing of the negative voltage pulse is shown. At this instance, ion beamlets are readily extracted, and directed to the substrate position, as shown in FIG. 4D.

Thus, in accordance with various embodiments, the duty cycle and frequency of voltage pulses may be set to provide a duration for a given pulse that exceeds the time required for plasma sheath collapse (plasma sheath collapse period) and the beginning of extraction of an ion beam. In the above example, assuming a minimum plasma sheath collapse period of 4 μsec, a pulse duration of 10 μs or greater may be appropriate to ensure proper extraction of an ion beam. At a 50% duty cycle this pulse duration equates to a pulse period of 20 μs or greater, meaning a voltage pulse frequency may be set at 50 kHz or lower to effectively extract ions in the scenario of FIGS. 2A-2D.

Figure 3:
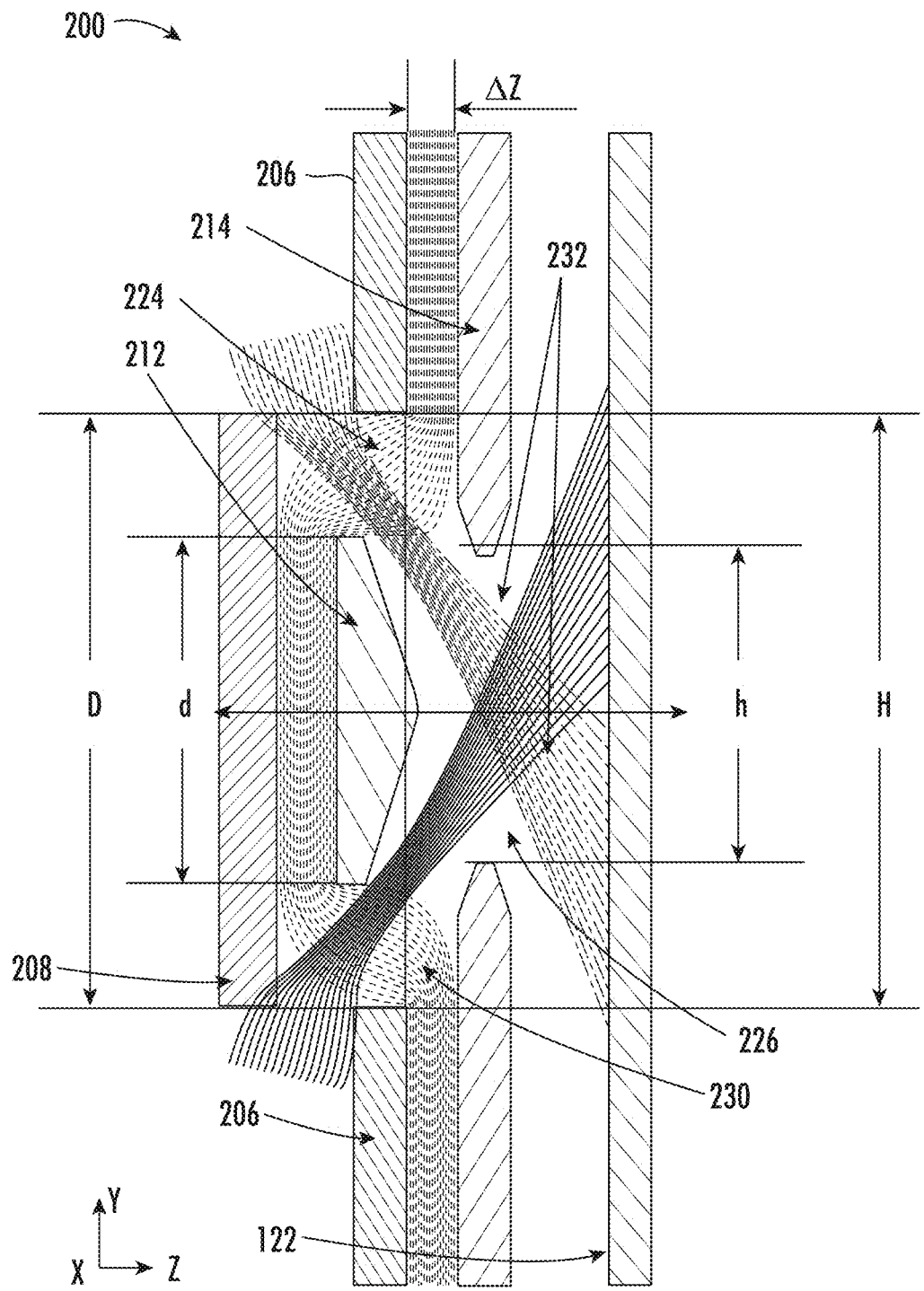
FIG. 3 depicts an operation scenario for a processing apparatus arranged according to embodiments of the disclosure, and illustrate beamlets, shapes, and electrostatic potential distributions in the extraction area.

FIG. 3 depicts an operation scenario for a processing apparatus arranged according to additional embodiments of the disclosure, and illustrate beamlets, shapes, and electrostatic potential distributions in the extraction area. More particularly, FIG. 3 depicts the results of OPERA modelling for the case of all-conductive extraction assembly components. In FIG. 3, an extraction assembly 200 is shown, including an electrically conductive variant of beam blocker 108, shown as beam blocker 208, and electrically conductive variant of plasma plate 106, shown as plasma plate 206. In particular, the plasma plate 206 has a rectangular shaped extraction aperture, shown as extraction aperture 224, of height H and 400 mm length (the direction perpendicular to the plane of the paper). The beam blocker 208 has a height D, approximately equal to the height H, while the length (into the page) may be slightly longer than the length of the extraction aperture 224 length to allow mechanical connection with the plasma plate 206. Both the beam blocker 208 and the plasma plate 206 are held at ground (zero electric potential). Parallel with the plasma plate 206 and separated from the plasma plate 206 by a gap Δz, is a biasable extraction plate, shown as extraction plate 214. The extraction plate 214 has a rectangular extraction aperture, shown as extraction aperture 226, of height h and the same length in the x-direction as the extraction aperture 224 in the plasma plate 206. In front of the extraction aperture 226 is placed a biasable blocker electrode, shown as non-planar electrode 212, having the height d, which dimension may be equivalent to h, and extending into the page (along the X-axis) sufficiently to cover the rectangular opening of extraction aperture 226. Both the extraction plate 214 and the non-planar electrode 212 are biased at the same potential as the substrate 122, which potential for the case shown is −1 kV.

As a result of this arrangement, electrostatic field lines 230 are shaped such that the ion beamlets 232 are extracted through the spaces between the non-planar electrode 212 and the extraction plate 214 at a high extraction angle, where the extraction angle is defined with respect to a normal to the plane (X-Y plane) of the extraction plate 214, meaning with respect to the Z-axis. This simulation thus yields a very high mean angle at the substrate plane for the two different beamlets of +/−60° (with respect to the normal on the substrate plane, meaning with respect to the Z-axis). The electrostatic equipotential lines do not extend beyond the extraction plate 214, which result means the substrate 122 is effectively not part of the extraction assembly 200. This result confers a big advantage, in that the secondary electrons generated by the ion bombardment on the substrate 122 surface will not be accelerated toward the extraction assembly 200. Furthermore, given the fact the biasable electrodes obstruct the line-of-sight between a plasma and the substrate 122, less etch byproducts will diffuse from the substrate 122 to the plasma chamber (to the left in the figure), resulting in less plasma chamber contamination. The providing of ion beams at a large mean angle facilitates processing 3D surfaces, including surfaces of structures on the substrate 122 oriented along the Z-axis. The large angle of incidence also entails a larger on-substrate beam foot print, or approximately 36 mm along the Y-direction. This relatively large footprint along the Y-axis means that in order to process a 300 mm wafer uniformly, the wafer scanning range in the y-direction should be at least 372 mm (300 mm+2×36 mm) so that both the top part and the bottom part of the wafer will be exposed to the beam.

FIGS. 4A-4D depict further operation scenarios for another processing apparatus, showing different configurations of an extraction plate, and the concomitant beamlets, shapes, and electrostatic potential distributions in the extraction area. As noted, in the case of highly reactive plasmas, a useful property of a plasma chamber is when the walls that come in contact with the plasma to be made of dielectric materials so that there will not be contamination of the plasma with metals or carbon coming from the walls. Accordingly, the extraction assembly 250 of FIGS. 4A-4D is provided with components that provide dielectric material in contact with a plasma (not shown). In addition to the aforementioned components of FIG. 3, the extraction assembly 250 includes a beam blocker 258 and plasma plate 256, each formed of a dielectric material. The extraction plate 254, like the aforementioned extraction plates, is formed from an electrically conductive material, and defines a second extraction aperture 260. According to various embodiments, the extraction plate 254 may comprise a first part 254A and a second part 254B, mutually movable with respect to one another along a scan direction (Y-axis), so as to change a size of the second extraction aperture 260. In addition, the extraction plate 254 may be movable with respect to the plasma plate 256, along the Z-axis.

Figure 4A:
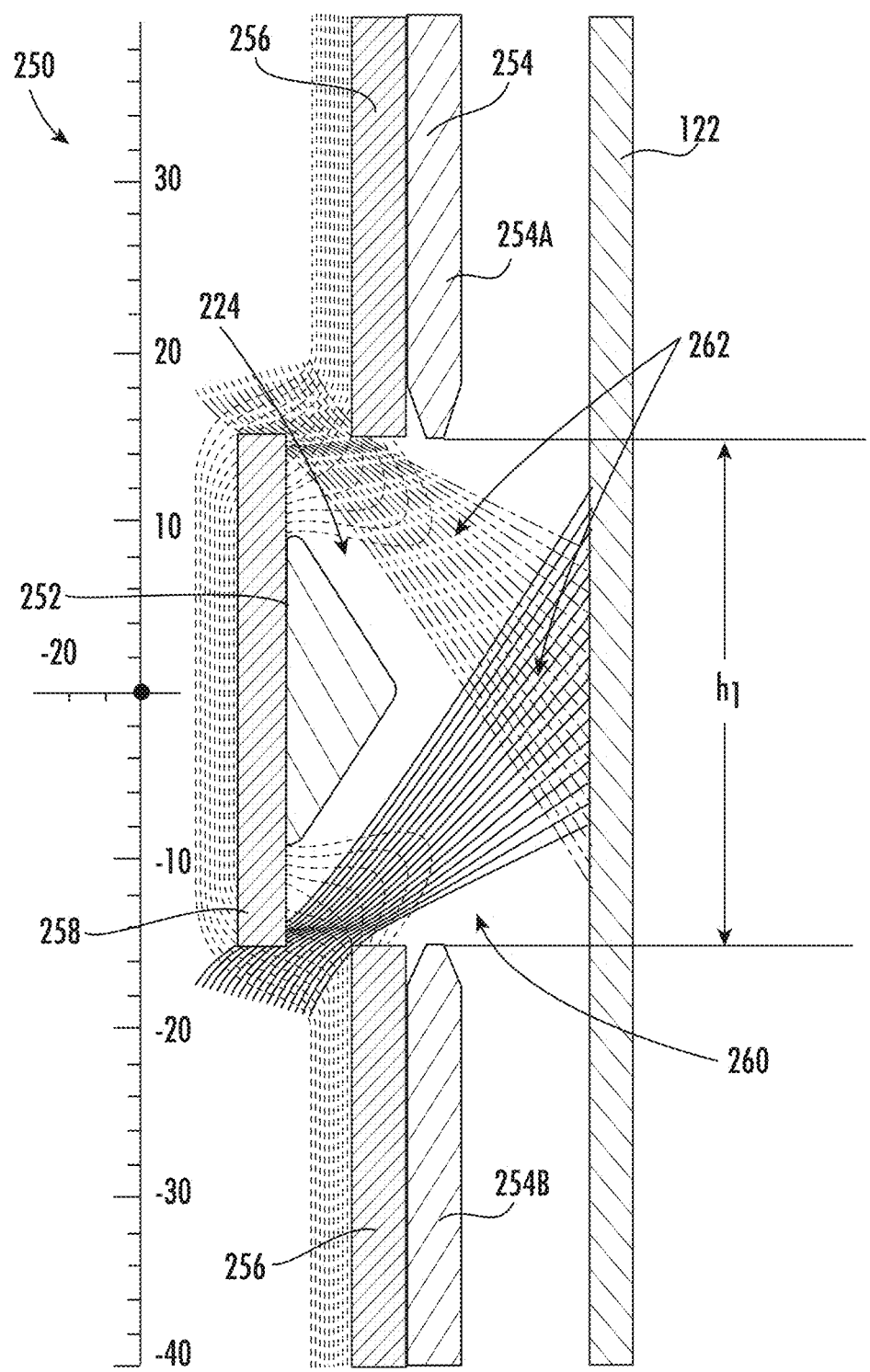
FIGS. 4A-4D depict further operation scenarios for another processing apparatus, showing different configurations of an extraction plate, and the concomitant beamlets, shapes, and electrostatic potential distributions in the extraction area.
Figure 4B:
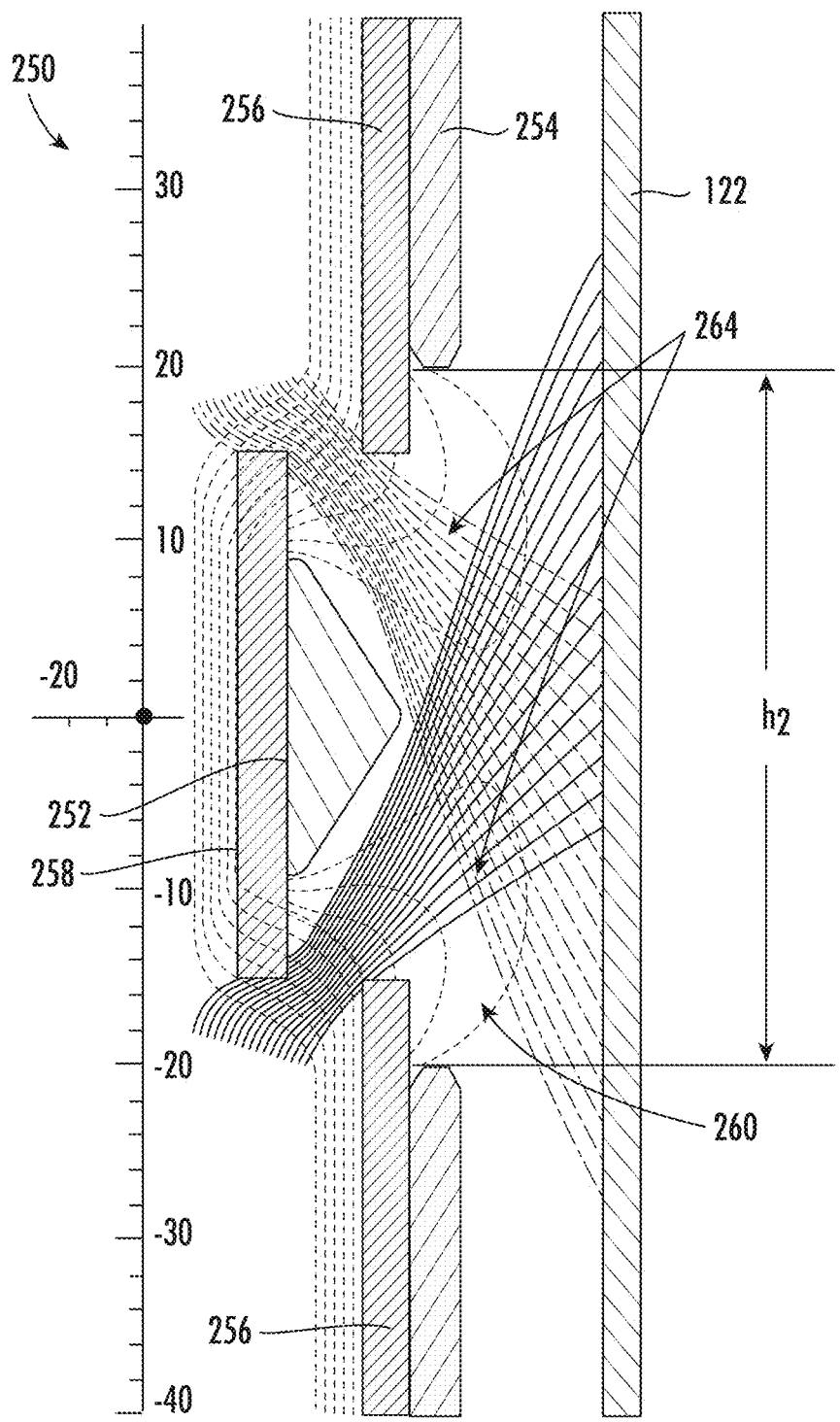
Figure 4C:
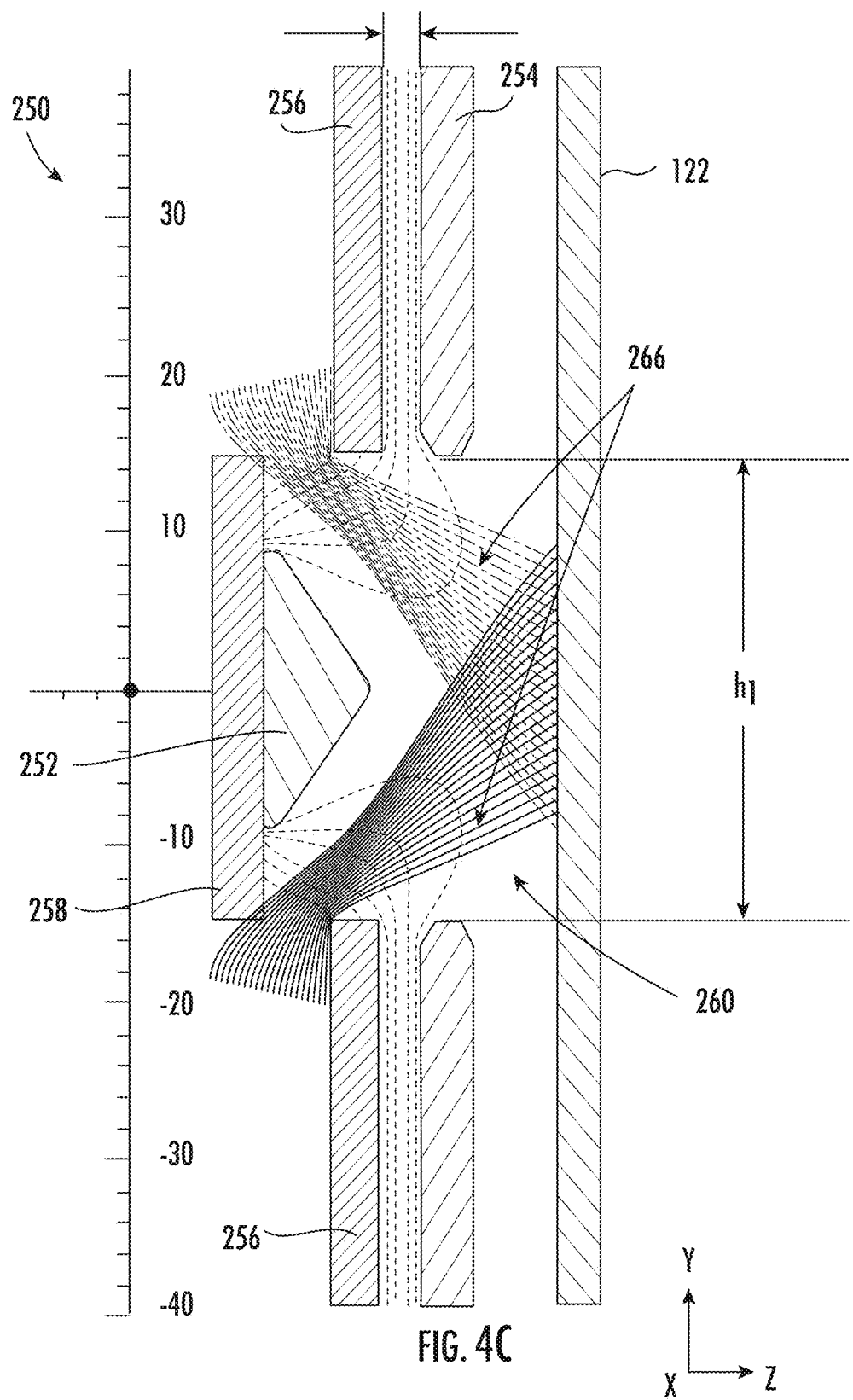
Figure 4D:
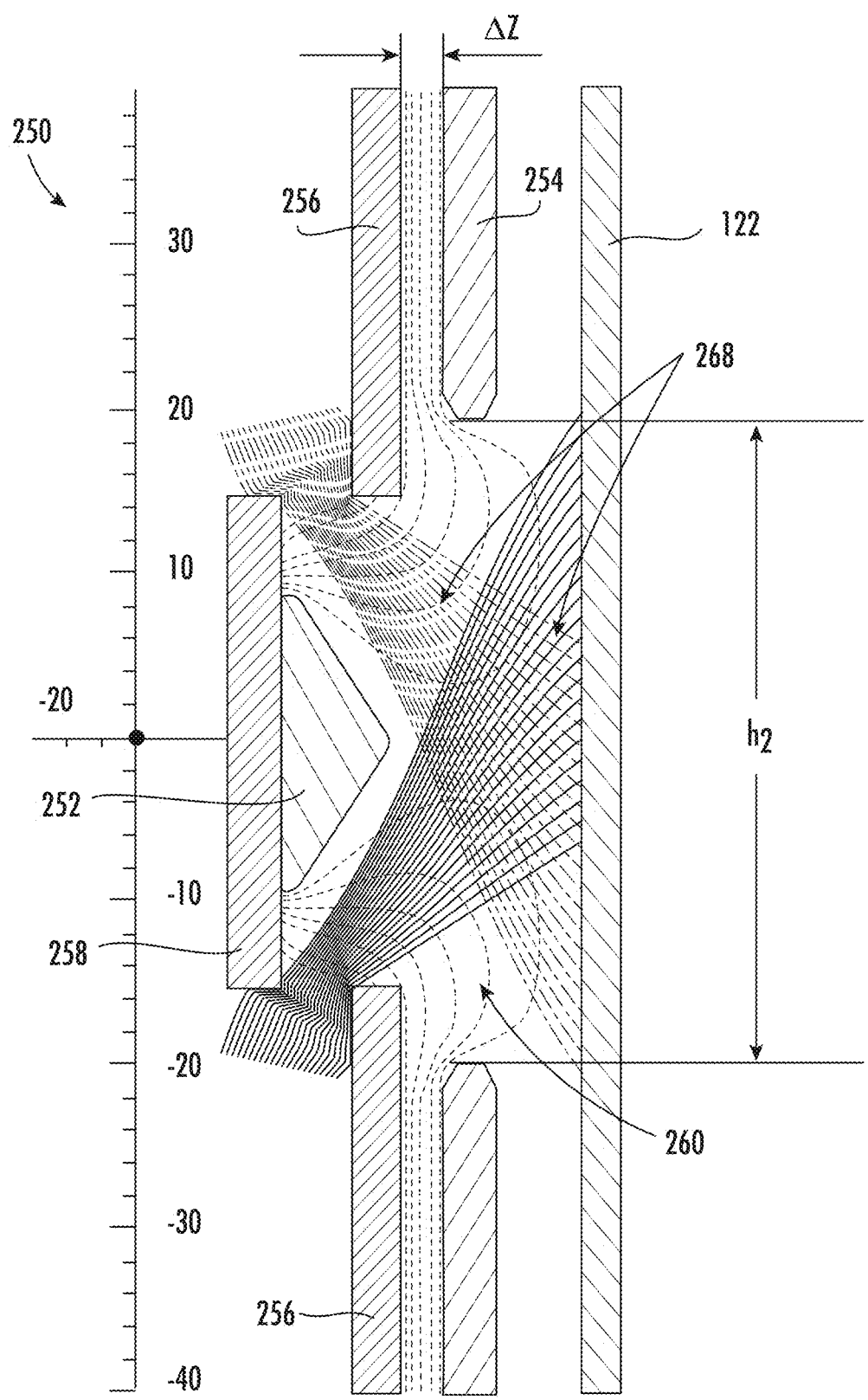

The FIGS. 4A-4D depict simulations under four different configurations of the extraction plate 254 where the plasma plate 256 and the beam blocker 258 are made of dielectric material (quartz in this case). The dimensions for this embodiment, in FIG. 3, and in FIGS. 5A-5B to follow are shown in mm. Notably, the extraction plate 254 and non-planar electrode 252, while being partially formed from an electrically conductive component, are made of a conductive inner portion, coated with a thin dielectric film. In FIG. 4A and FIG. 4C, the second extraction aperture 260 in the extraction plate 254 has a value of h1, while In FIG. 4B and FIG. 4D, the second extraction aperture 260 in the extraction plate 254 has a value of h2. In FIG. 4A and FIG. 4B, the extraction plate 254 is in contact with the plasma plate 256, while in FIG. 4C and FIG. 4B, the extraction plate 254 is separated by a gap $\Delta z$ from the plasma plate 256. For all configurations the non-planar electrode 252 is triangularly or parabolically shaped and in contact with the beam blocker 258. The emissivity curves have been simulated for the respective ion beams shown as ion beams 262, ion beams 264, ion beams 266, and ion beams 268, yielding total on-substrate footprint along the Y-axis of 24 mm (FIG. 4A); 38 mm (FIG. 4B); 20 mm (FIG. 4C); and 42 mm (FIG. 4D). The corresponding ion angular distributions (IADs) of the beamlets corresponding to the configurations shown in 4A are: mean angle 44°, angular spread ~14°; in FIG. 4B: mean angle 55°, angular spread ~10°; in FIG. 4C: mean angle 42°, angular spread ~13°; and in FIG. 4D: mean angle 53°, angular spread ~11°. Thus, the mean angle and footprint may be substantially varied by varying the configuration of the extraction plate 254.

Figure 5A:
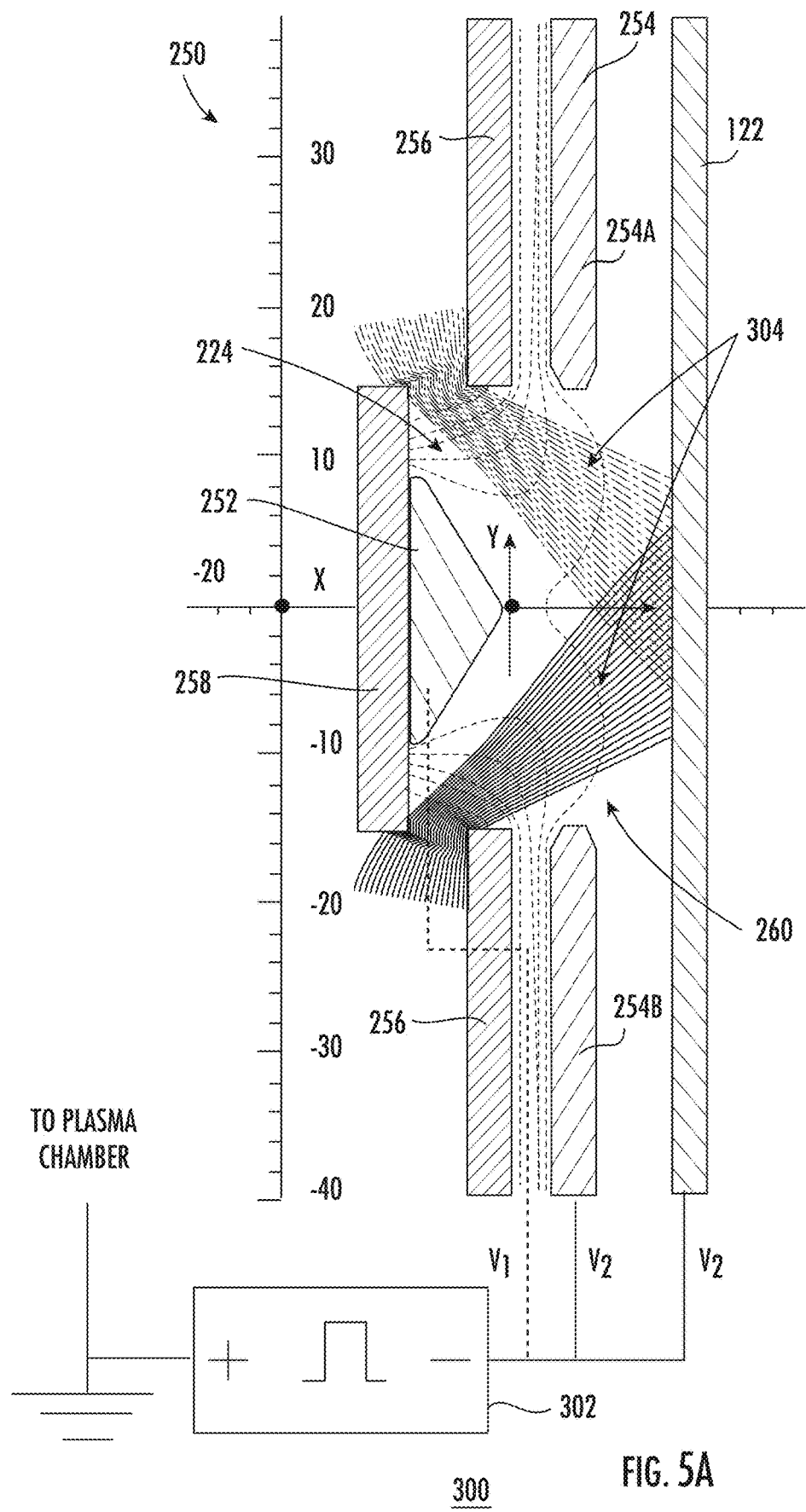
FIGS. 5A-5B depict further operation scenarios of a processing system, showing the effect of independently biasing a non-planar electrode of an extraction assembly, including, equipotential lines distributions, and ion beam trajectories.
Figure 5B:
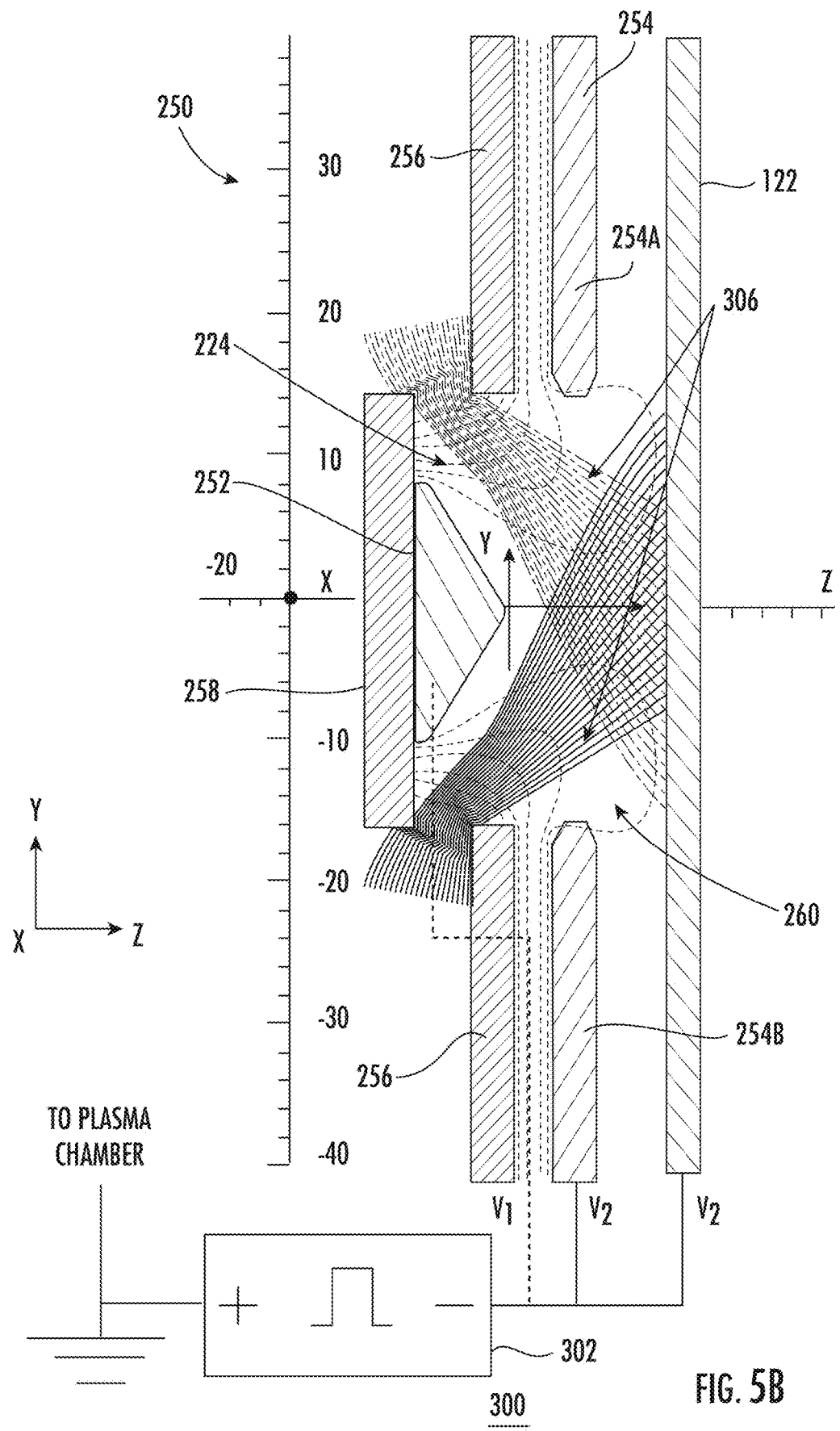

In accordance with further embodiments of the disclosure, a bias voltage system may be configured to separately apply voltage to a non-planar electrode as opposed to a substrate or extraction plate. FIGS. 5A-5B depict further operation scenarios of a processing system 300, showing the effect of independently biasing a non-planar electrode of an extraction assembly, including, equipotential lines distributions, and ion beam trajectories. The processing system 300 may include an extraction assembly 250, as generally described above with respect to FIGS. 4A-4D. In the processing system 300, a bias voltage system 302 is provided, having components arranged to separately bias the non-planar electrode 252 with respect to the extraction plate 254, substrate 122, and plasma chamber (not separately shown). In FIG. 5A a scenario is shown where the substrate 122 and extraction plate 254 are biased at a voltage V2, equal to −1 kV, while the non-planar electrode 252 is biased at +100 V above this potential, i.e., −900 V below the ground potential. In FIG. 5B the substrate 122 and extraction plate 254 are biased at −1 kV while the non-planar electrode 252 is −100 V below this value, i.e., −1.1 kV relative to the ground.

Emissivity curves and ion angular distributions simulated for the configurations of FIG. 5A and FIG. 5B yield the following results. For configuration shown in FIG. 5A the total on-substrate footprint of ion beams 304 is 17 mm, along the Y-axis, the mean angle of ion beams 304 is 39°, and angular spread is 11° For the configuration shown in FIG. 4B the total on-substrate footprint of ion beams 306 is 28 mm, mean angle 42°, and angular spread 14°. Thus, modest changes in the relative voltage applied by the independent biasing of the non-planar electrode 252 with respect to the extraction plate 254 and substrate 122, may result in substantially changes in ion beam properties, such as footprint, and also angular spread.

Figure 6C:
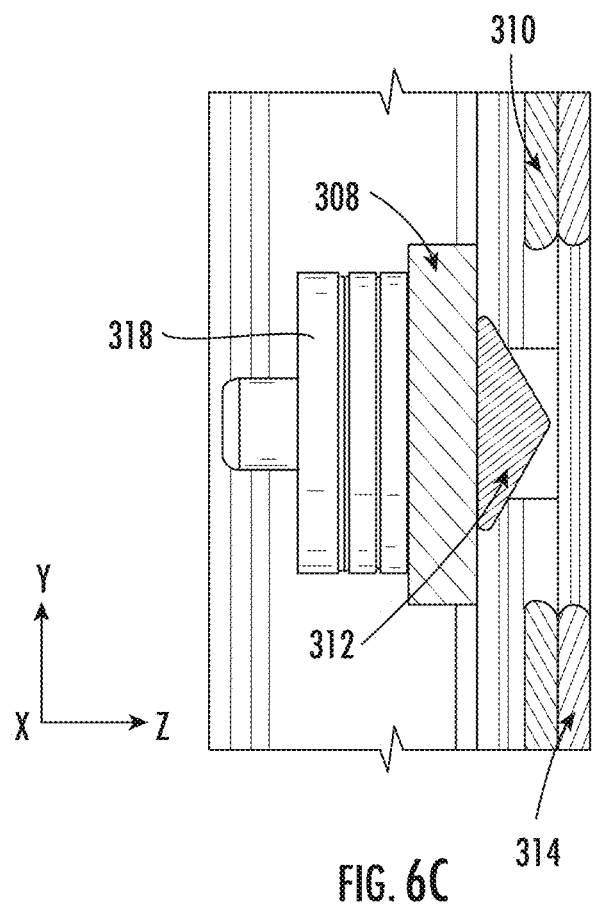
FIG. 6C illustrates a side cross-sectional view of the extraction assembly of FIG. 6A.

FIG. 6A illustrates a portion of a processing system 350, including a face view of an extraction assembly 330, according to embodiments of the disclosure. FIG. 6B illustrates a detail of the extraction assembly of FIG. 6A, while FIG. 6C illustrates a side cross-sectional view of the extraction assembly of FIG. 6A. The extraction assembly 330 is arranged on one side of a plasma chamber housing 320. The extraction assembly 330 includes a plasma plate 310, beam blocker 308, extraction plate 314, and non-planar electrode 312, shaped as a triangular shape. Notably, as shown in FIG. 6C, the beam blocker 308 may be held in a plasma chamber using a pedestal 318.

With reference to Cartesian coordinate system of the aforementioned figures, the extraction plate 314 includes an extraction aperture 316, rectangularly shaped, elongated with the side along x direction, where the relative positioning of the (biasable) extraction plate 314 with respect to the plasma plate 310 is possible. As shown in FIG. 6B, the non-planar electrode 312 is placed in front of the beam blocker 308. The expanded view depicted in FIG. 6B also shows the non-planar electrode is held in place by holders 318, fixed on the extraction plate 314. The cross-section view depicted in FIG. 6C shows the rectangular openings in the plasma plate 310 and the extraction plate 314 may have the same height along the Y-axis, and the extraction plate 314 and plasma plate 310 are in contact with one another. The non-planar electrode 212 is shorter than the beam blocker 308 along the Y-axis, and the beam blocker 308 and the non-planar electrode 312 are in contact with one another.

Figure 7:
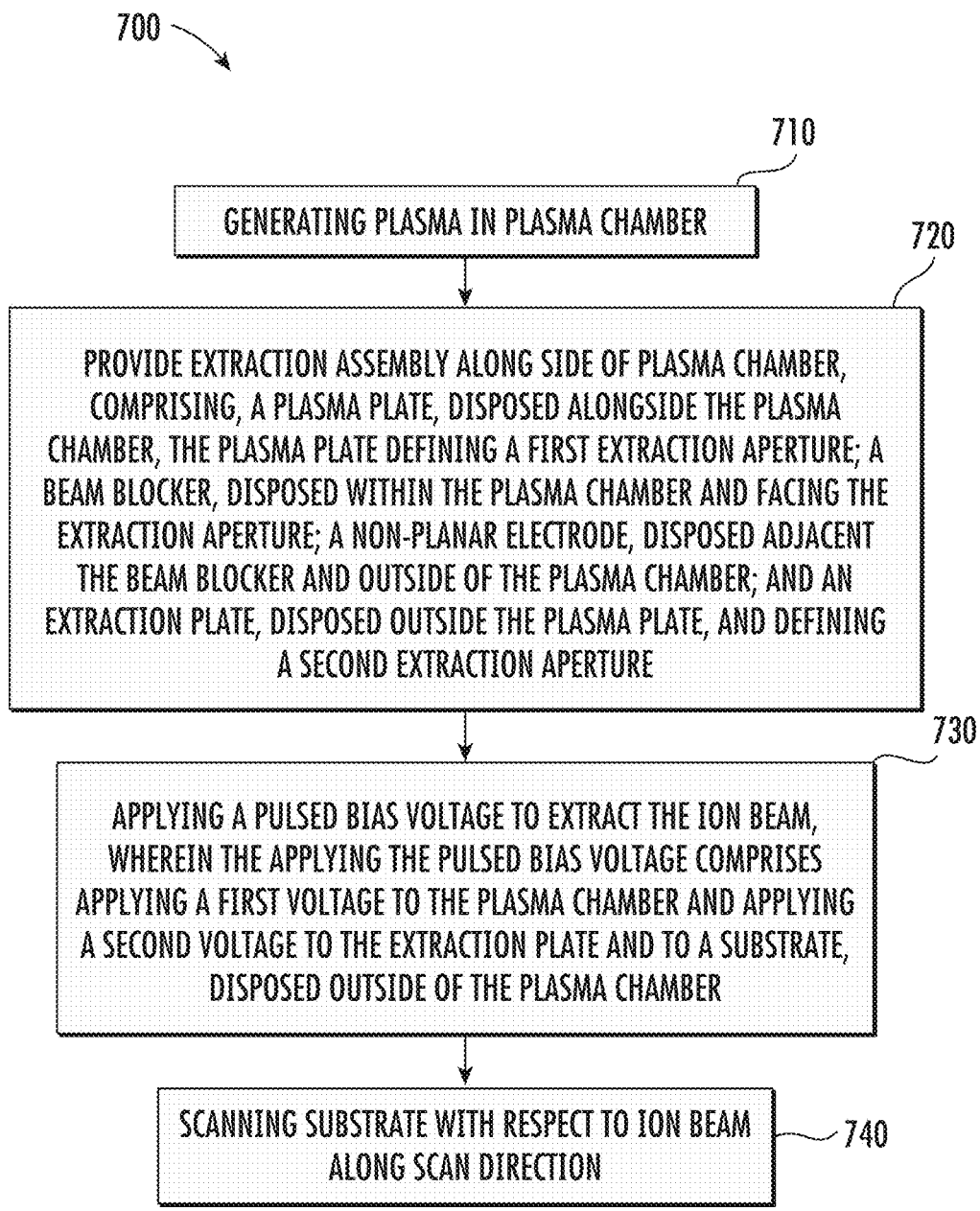
FIG. 7 presents an exemplary process flow.

FIG. 7 depicts an exemplary process flow, shown as process flow 700. At block 710, a plasma is generated in a plasma chamber. The plasma may be generated using any suitable excitation means, power source, and combination of gases, as known in the art. The plasma chamber may at least one conductive portion to receive an external bias or grounding voltage.

At block 720, an extraction assembly is provided along a side of the plasma chamber. In various non-limiting embodiments, the side of the plasma chamber may be a bottom of the plasma chamber, such as a horizontal surface, or may be a vertical side of the plasma chamber. The extraction assembly may include a plasma plate, disposed alongside the plasma chamber, where the plasma plate defines a first extraction aperture. In some embodiments, the first extraction aperture may be elongated along a first direction. The extraction assembly may also include a beam blocker, disposed within the plasma chamber and facing the extraction aperture. In other words, the beam blocker may be disposed at least partially within the plasma chamber, to at least partially block components disposed outside the plasma chamber and facing the first extraction aperture from a line of sight to plasma within the plasma chamber. The extraction assembly may further include a non-planar electrode, disposed adjacent the beam blocker and outside of the plasma chamber. In various embodiments, the non-planar electrode may include an electrically conductive body. The extraction assembly may further include an extraction plate, disposed outside the plasma plate, and defining a second extraction aperture. The extraction plate may include an electrically conductive body.

At block 730, a pulsed bias voltage is applied to extract the ion beam, wherein the application of the pulsed bias voltage involves applying a first voltage to the plasma chamber and applying a second voltage to the extraction plate and to a substrate, disposed outside of the plasma chamber. In some embodiments, the first voltage may be ground potential, applied to the plasma chamber, while the second voltage is a negative voltage, applied to extract positive ions from the plasma chamber. In some embodiments, the second voltage may also be applied to the non-planar electrode, while in other embodiments, a third voltage may be applied to the non-planar electrode. According to some embodiments, the pulsed bias voltage may be applied at a frequency and duty cycle wherein the pulse duration exceeds a sheath collapse duration, as defined hereinabove.

At block 740, the substrate is scanned with respect to the ion beam along a scan direction, which direction may be perpendicular to the first direction, of elongation of the first extraction aperture and the second extraction aperture.

The present embodiments provide at least the following advantages: A first advantage is found in an extraction assembly having a novel combination of insulating-electrically conductive electrodes, which assembly allows extraction of ion beamlets having high on-wafer incidence angles (>50° Another advantage is that for compact ion beam systems, the substrate is removed from the extraction optics configuration, while maintaining a simple diode electrostatic extraction process. A further advantage is the use of the same power supply to simultaneously bias the substrate and the biasable electrodes, simplifying cost and design complexity. A further example of advantages of the present embodiments, is the ability to use a simple low voltage power supply floating on a high voltage power supply to provide differential biasing to a non-planar electrode with respect to an extraction plate and substrate.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. An ion beam processing apparatus comprising:
   a plasma chamber;
   a plasma plate, disposed alongside the plasma chamber, the plasma plate defining a first extraction aperture;
   a beam blocker, disposed within the plasma chamber and facing the extraction aperture;
   a non-planar electrode, disposed adjacent the beam blocker and outside of the plasma chamber;
   an extraction plate, disposed outside the plasma plate, and defining a second extraction aperture, aligned with the first extraction aperture; and
   an extraction voltage supply, being electrically coupled to bias the extraction plate, the non-planar electrode, and the substrate at a same voltage with respect to the plasma chamber.

2. The ion beam processing apparatus of claim 1, wherein the plasma plate comprises an electrical insulator body, and the beam blocker comprises an electrical insulator body.

3. The ion beam processing apparatus of claim 1, wherein the non-planar electrode comprises a first dielectric coating, surrounding an electrically conductive inner electrode, and wherein the extraction plate comprises a second dielectric coating, disposed on an electrically conductive inner plate portion.

4. The ion beam processing apparatus of claim 1, wherein the non-planar electrode comprises a triangular shape in cross-section along a first direction, the first direction being perpendicular to a plane of the plasma plate.

5. The ion beam processing apparatus of claim 1, wherein the extraction plate is movable with respect to the plasma plate, along a first direction, the first direction being perpendicular to a plane of the plasma plate.

6. The ion beam processing apparatus of claim 1, wherein the first extraction aperture and the second extraction aperture comprise an elongated shape.

7. The ion beam processing apparatus of claim 1, wherein the extraction plate comprises a first part and a second part, mutually movable with respect to one another along a scan direction, so as to change a size of the second extraction aperture.

8. The ion beam processing apparatus of claim 1, wherein the beam blocker, non-planar electrode, plasma plate, and extraction plate are mutually disposed to extract an ion beam as a pair of ion beamlets, characterized by an extraction angle having a value of 30 degrees or greater with respect to a normal to a plane of the plasma plate.

9. An ion beam processing system comprising:
a plasma chamber;
an extraction assembly, disposed along a side of the plasma chamber, comprising:
  a plasma plate, disposed alongside the plasma chamber, the plasma plate defining a first extraction aperture;
  a beam blocker, disposed within the plasma chamber and facing the extraction aperture;
  a non-planar electrode, disposed adjacent the beam blocker and outside of the plasma chamber; and
  an extraction plate, disposed outside the plasma plate, and defining a second extraction aperture, aligned with the first extraction aperture; and
an extraction voltage system, electrically coupled to the plasma chamber and the extraction plate to generate a bias voltage between the extraction plate and the plasma chamber, the extraction voltage system being electrically coupled to bias the extraction plate, the non-planar electrode, and the substrate at a same voltage with respect to the plasma chamber.

10. The ion beam processing system of claim 9, the extraction voltage system having a pulse component, to generate a pulsed bias voltage between the extraction plate and the plasma chamber.

11. The ion beam processing system of claim 9, wherein the plasma plate comprises an electrical insulator body, and the beam blocker comprises an electrical insulator body.

12. The ion beam processing system of claim 9, wherein the non-planar electrode comprises a first dielectric coating, surrounding an electrically conductive inner electrode, and wherein the extraction plate comprises a second dielectric coating, disposed on an electrically conductive inner plate portion.

13. The ion beam processing system of claim 9, wherein the non-planar electrode comprises a triangular shape in cross-section along a first direction, the first direction being perpendicular to a plane of the plasma plate.

14. The ion beam processing system of claim 9, wherein the extraction plate is movable with respect to the plasma plate, along a first direction, the first direction being perpendicular to a plane of the plasma plate.

15. The ion beam processing system of claim 9, wherein the extraction plate comprises a first part and a second part, mutually movable with respect to one another along a scan direction, so as to change a size of the second extraction aperture.

16. The ion beam processing system of claim 9, further comprising a process chamber to house a substrate, the extraction voltage system being electrically coupled to supply a first voltage to the plasma chamber, and being electrically coupled to supply a second voltage to the extraction plate, the non-planar electrode, and the substrate, the second voltage being more negative than the first voltage.

17. The ion beam processing system of claim 16, wherein the first extraction aperture and the second extraction aperture are elongated along a first direction, the ion beam processing system further comprising a substrate stage, disposed to scan the substrate along a scan direction, perpendicular to the first direction.

* * * * *